United States Patent [19]

Baird et al.

[11] 4,229,828
[45] Oct. 21, 1980

[54] BI-MODE MILLIMETER WAVE MIXER

[75] Inventors: Joseph M. Baird, Newbury Park; Paul M. Schwartz, Woodland Hills, both of Calif.

[73] Assignee: Hughes Aircraft Company, Culver City, Calif.

[21] Appl. No.: 864,027

[22] Filed: Dec. 23, 1977

[51] Int. Cl.³ .............................................. H04B 1/26
[52] U.S. Cl. .................................... 455/326; 329/161
[58] Field of Search ............... 325/340, 341, 364, 365, 325/373, 445, 446; 343/5 R, 5 PD, 772, 821, 822, 850; 321/69 W; 332/51 W; 329/160, 161; 333/5, 103, 104, 136, 137; 455/326, 325, 328

[56] References Cited

U.S. PATENT DOCUMENTS

| | | | |
|---|---|---|---|
| 3,094,663 | 6/1963 | Siegel | 325/340 |
| 3,584,306 | 6/1971 | Spacek | 325/446 |
| 3,638,126 | 1/1972 | Spacek | 325/446 |
| 3,823,380 | 7/1974 | Young | 325/445 |
| 3,859,660 | 1/1975 | Craven | 325/445 |
| 4,099,228 | 7/1978 | Cohn | 363/159 |

*Primary Examiner*—Benedict V. Safourek
*Assistant Examiner*—Tommy P. Chin
*Attorney, Agent, or Firm*—William J. Bethurum; W. H. MacAllister

[57] ABSTRACT

The specification describes a means and method for mixing millimeter wave RF energy of one chosen transverse electric (TE) waveguide mode with a local oscillator signal of another chosen TE waveguide mode, and such mixing is accomplished by applying those RF and local oscillator signals to a pair of reverse poled and parallel connected mixer diodes. These mixer diodes are connected at a chosen location within a rectangular waveguide and between top and bottom walls thereof and are symmetrically spaced across the width of the waveguide with respect to the center or a/2 location in the guide, with "a" being the width dimension in the guide. An IF output signal is derived at a common output node for the mixer diodes.

15 Claims, 4 Drawing Figures

BI-MODE MILLIMETER WAVE MIXER

SUMMARY OF PREFERRED EMBODIMENTS

In one preferred embodiment of the invention, two oppositely poled mixer diodes are connected in parallel between top and bottom walls of a rectangular waveguide at approximately the ¼ and ¾ width locations therein, and the two modes employed are the $TE_{10}$ and $TE_{20}$ rectangular waveguide modes, with either mode suitable for use as the RF mode and the other opposite mode used as the local oscillator (LO) mode. An optimum combination of addition and subtraction of the electromagnetic field intensities of the local oscillator and RF signals occur respectively at the above ¼ and ¾ width locations within the waveguide where the reverse poled mixer diodes are mounted. Such positioning of these diodes across the width of the waveguide and relative to the mutually superimposed electromagnetic field patterns for the local oscillator and RF input signals provides a high IF conversion efficiency in the mixer. Thus, large magnitude output intermediate frequency (IF) signals may be derived at a coaxial T-connection made at an output node which is common to both mixer diodes.

In an alternative embodiment of the invention, $TE_{10}$ mode signals are applied to the mixer diodes from sources of both RF and local oscillator energy, with the local oscillator frequency being the ½ sub-harmonic frequency of a normal local oscillator frequency which is defined as the difference between the RF and IF signal frequencies.

FIELD OF THE INVENTION

This invention relates generally to balanced mixers for microwave and millimeter wave signal processing and more particularly to a bi-mode millimeter wave mixer of the type wherein reverse poled mixer diodes are suspended in a rectangular waveguide.

BACKGROUND

Balanced mixers have utilized mixer diode pairs mounted in a variety of configurations in or adjacent to several different types of wave propagating structures. Utilization of these diode pairs to mix local oscillator and incoming RF input signals and to generate sum and difference IF signal currents therein is generally well known in the art and is described, for example, in U.S. Pat. Nos. 3,584,306 and 3,638,126. Similar techniques are also described in a publication by M. V. Schneider et al entitled "Strip Line Down Converter With Sub-Harmonic Pumping," Bell System Technical Journal, Vol. 53, pages 1179–1183, July-Aug. 1974.

In recent years, the increased interest in the millimeter wave frequency and wavelength range (30–300 GHz) of the electromagnetic frequency spectrum and particularly the interest in certain useful frequency transmission "windows" therein have precipitated a corresponding and continuing size reduction in the waveguide structures used for propagating these millimeter waves. One of these transmission windows of interest is at 140 GHz, and using the conventional reduced height waveguide structures for a typical mixer wafer mount, the corresponding waveguide size would be approximately 0.065 inches wide and approximately 0.0065 inches high. Although the mounting of mixer diodes within these very small dimensions could probably be accomplished, such dimensions correspond to the upper frequency limit for the normal conventional honeycomb diode whisker mount configurations.

Therefore, it is manifestly desirable to provide a balanced mixer-in-waveguide structure which is capable of mixing frequencies out to 300 GHz or higher, but which does not, of necessity, require corresponding further reductions in waveguide size relative to the above dimensions.

THE INVENTION

The general purpose of this invention is to provide such a balanced mixer capable of frequency mixing signals at 300 GHz or higher without requiring the very small dimension waveguide structures such as those described above. To accomplish this purpose, we have discovered and therefore developed a novel millimeter wave mixing technique wherein a pair of parallel connected reverse-poled mixer diodes are symmetrically spaced across the width dimension of a rectangular waveguide and connected between top and bottom walls thereof. Local oscillator and RF input signals of preselected transverse electric (TE) waveguide modes are applied to these mixer diodes to thereby generate difference currents in the diodes and an IF output signal porportional thereto.

In one embodiment of the invention, a rectangular waveguide of a predetermined height, b, and a predetermined width, a, is provided with a ratio of b/a sufficiently small to cut off the $TE_{01}$ and $TM_{01}$ modes of wave propagation. Such a waveguide can then be used to propagate frequencies in a range of between two and three times the cut-off frequency of the $TE_{10}$ mode of wave propagation within the waveguide. This $TE_{10}$ mode is the wave propagation mode of one of the input signals applied to one end of the rectangular waveguide, whereas the other input signal is applied to the other end of the waveguide in the $TE_{20}$ mode.

Also, in this inventive embodiment, a first mixer diode is mounted between top and bottom walls of the rectangular waveguide at approximately the a/4 width location therein, and a second, reverse poled mixer diode is connected in parallel with the first mixer diode and is also mounted between the top and bottom walls of the rectangular waveguide at approximately the 3a/4 width location therein. These a/4 and 3a/4 width locations in the rectangular guide correspond to the two maximum points on the $TE_{20}$ mode vector pattern in the waveguide. Using this structure, RF incoming signals in either the $TE_{10}$ or the $TE_{20}$ propagation mode are coupled into one end of the rectangular waveguide and mixed at the diode pair with the local oscillator signals introduced into the other end of the waveguide in the opposite $TE_{10}$ or $TE_{20}$ mode. The patterns of the intensity vectors of the electromagnetic fields of the local oscillator signal and RF input signal provide an optimum combination of current addition and current subtraction, respectively, in the two mixer diodes, thereby efficiently generating substantial sum and difference currents through the mixer diodes and producing intermediate frequency (IF) output signals at a circuit mode which is common to both of the diodes.

Thus, rectangular waveguide structures having height and width dimensions as large as 0.018" and 0.058", respectively, may be utilized in combination with a pair of mixer diodes for mixing incoming RF signal frequencies up to 300 GHz or higher with a local oscillator signal. In comparison to these dimensions, a conventional waveguide mixer at these frequencies would have height and width dimensions of approximately 0.015"×0.035", respectively. Thus, this invention facilitates mounting the mixer diodes in larger rectangular waveguides.

Accordingly, it is an object of the present invention to provide a new and improved millimeter wave mixer utilizing a bi-mode technique which is capable of efficiently frequency mixing signals out to 300 GHz or higher.

A further object is to provide a broadband balanced mixer of the type described wherein the waveguide portion of the mixer is of a height and width suitable for high yield manufacturing, easy handling and rapid interior diode mounting.

A further object is to provide a balanced mixer of the type described which is readily adaptable for interconnection to other conventional waveguide and mode conversion structures.

A further object is to provide a balanced mixer of the type described which may be constructed with relative ease and which is reliable and durable in operation.

These and other objects and features of the invention will become more fully apparent in the following description of the accompanying drawings.

DRAWINGS

FIG. 3 also illustrates the bi-mode mixer design region in which only the desired $TE_{10}$ and $TE_{20}$ modes are able to propagate.

Figure 1:
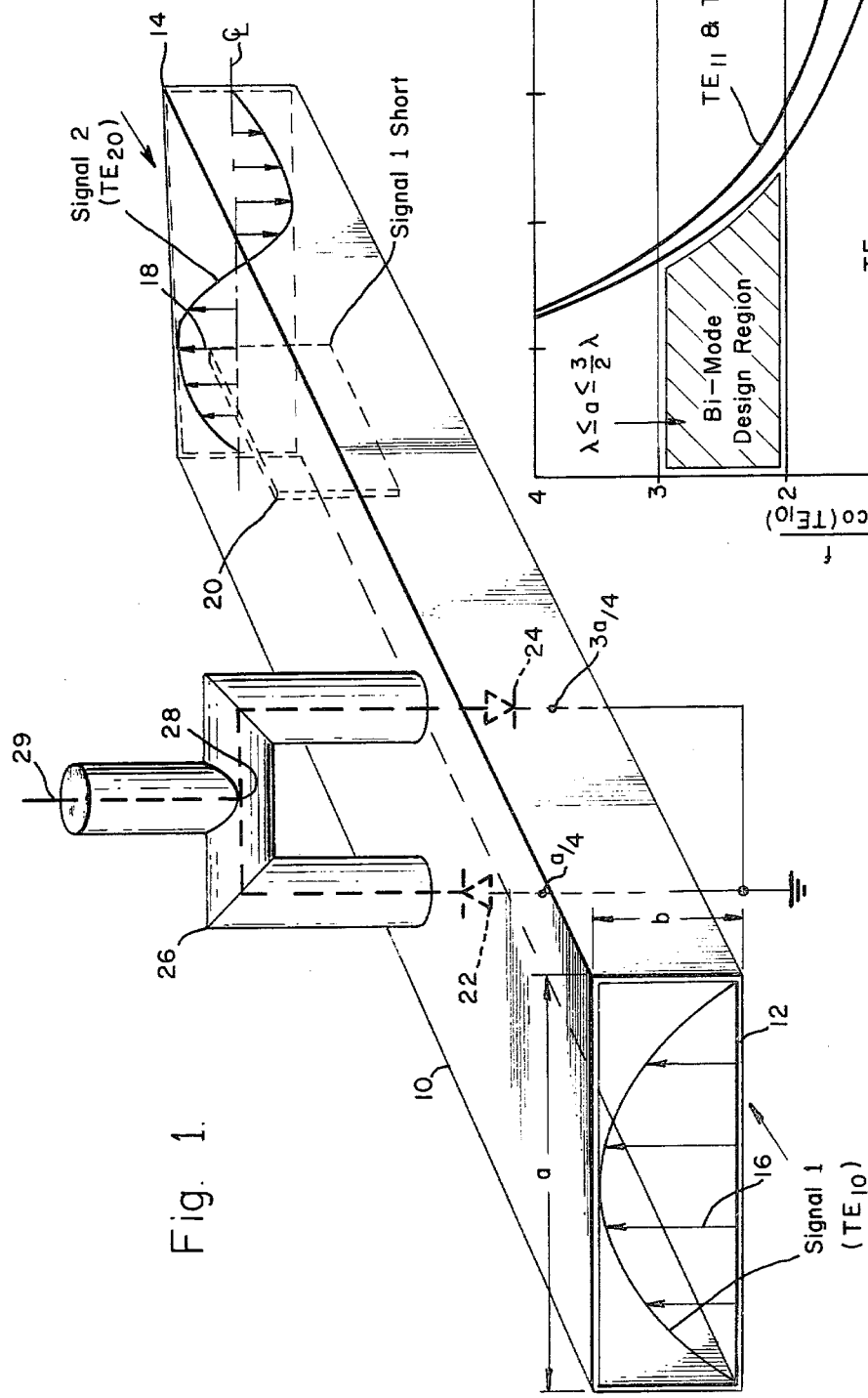
FIG. 1 is a fragmented isometric view of the diode pair balanced mixer circuit according to the invention.

Referring now to FIG. 1, there is shown a rectangular waveguide member 10 having a predetermined width dimension, a, and a predetermined height dimension, b, and these dimensions are discussed in more detail below. The waveguide 10 has one open end 12 thereof for receiving a first signal in the $TE_{10}$ propagation mode and another end 14 for receiving a second signal in the $TE_{20}$ propagation mode. The intensity of the vectors 16 and 18 of the electromagnetic field patterns for the two signals, respectively, are shown at the ends 12 and 14 of the rectangular waveguide 10, and a waveguide short 20 is provided as shown in a central portion of the waveguide 10. This short 20 is in the form of a thin rectangular metal vane which extends between top and bottom walls of the waveguide 10 and serves to short the first or $TE_{10}$ signal which is propagated thereto, thus preventing this signal from passing into the source of the second signal (not shown).

A pair of mixer diodes 22 and 24 are positioned as shown between the top and bottom walls of the waveguide 10 and are connected with reverse polarities respectively, at approximately the a/4 and 3a/4 width locations along the "a" or width dimension of the rectangular waveguide 10. These two locations coincide with the two maxima points on the $TE_{20}$ vector pattern of microwave energy applied to the two mixer diodes. It is at these a/4 and 3a/4 width locations (approximately) that the mutually superimposed RF and local oscillator (LO) field patterns of the first and second signals provide the optimum combination of addition and subtraction of the electromagnetic field intensity vectors within the guide 10. This in turn provides a highly efficient frequency mixing during the generation of sum and difference intermediate frequency (IF) currents in the two mixer diodes 22 and 24.

The mixer diodes 22 and 24 are grounded at the underside or bottom wall of the rectangular waveguide member 10, and these diodes 22 and 24 are interconnected as shown by way of a coaxial-T connection 26 having a common output node 28 therein. This common IF signal output node is, as shown, part of the coaxial inner conductor 29 from which intermediate frequency (IF) signal currents may be derived.

Figure 2:
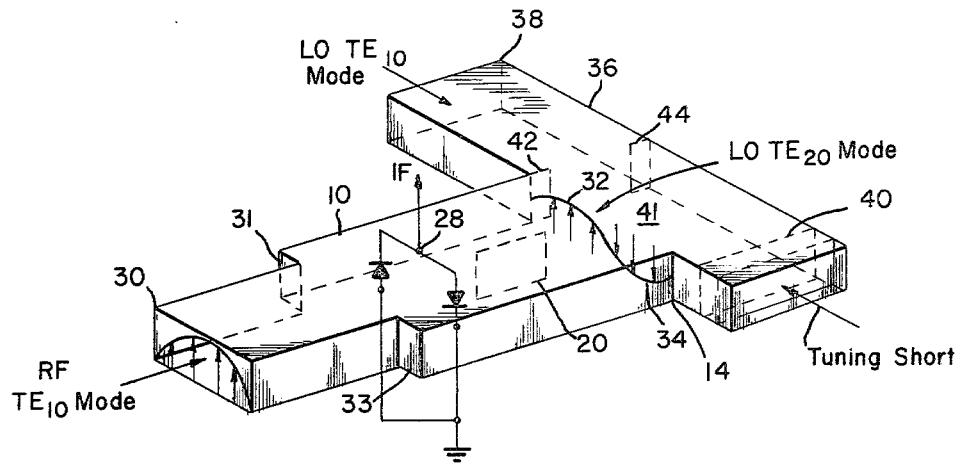
FIG. 2 is another isometric view of the balanced mixer circuit, including means for applying local oscillator and RF input signals thereto.

Referring now to FIG. 2, there is shown a dominant $TE_{10}$ mode input waveguide section 30 integrally joined to the end walls 31 and 33 of the waveguide 10 and having its width of a dimension sufficient to prevent propagation of the $TE_{20}$ waveguide mode within the waveguide. The other end 14 of the rectangular waveguide section 10 is connected as shown to a mutually perpendicular waveguide section 36, and this section 36 has an input end 38 thereof for receiving LO input $TE_{10}$ mode signals. This section 36 also includes a tuning short 40 which is connected at its other end for providing the desired impedance matching and resonance conditions within this rectangular waveguide section 36.

A pair of metal shorts (vanes) 42 and 44 are positioned as indicated adjacent to the intersection of the waveguide members 10 and 36, and these shorts 42 and 44 serve in combination with the tuning short 40 and cavity 41 therebetween to convert the $TE_{10}$ mode of local oscillator energy entering the LO input port 38 to the $TE_{20}$ mode at the waveguide opening 14. That is, the vanes 42 and 44 and the tuning short 40 define the boundaries of a second order mode waveguide cavity of approximately one wavelength in length, and this produces the local oscillator $TE_{20}$ standing wave pattern 32 at the input port 14 of the waveguide member 10. This wave pattern of $TE_{20}$ local oscillator energy is then coupled to the two mixer diodes 22 and 24 where it mixes with $TE_{10}$ mode RF signal received from the RF input waveguide section 30.

Figure 3:
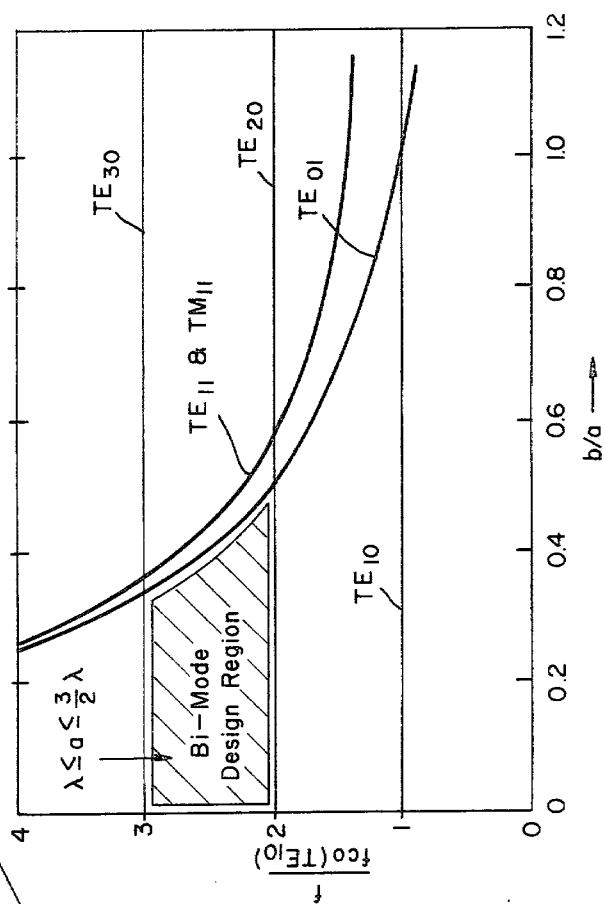
FIG. 3 is a graph plotting the ratio of the RF input frequency $TE_{10}$ mode cut-off frequency versus the height/width ratio (b/a) of the waveguide for which the lowest order modes begin propagating.

Referring now to FIG. 3, there are shown the various low order TE and TM modes that will propagate in a rectangular waveguide whose height/width ratio, b/a, is between 0 and 1.2, and where the ratio of the signal frequency to the cut-off frequency of the $TE_{10}$ mode is in the range of 0 to 4. Thus, if the signal frequency/$TE_{10}$ mode cut-off frequency ratio is maintained between 2 and 3, and if the height/width aspect ratio, b/a, for the rectangular waveguide 10 is selected to be below the cut-off frequency for the $TE_{01}$ mode (~0.3 to 0.5), then the rectangular waveguide 10 will sustain only the $TE_{10}$ and $TE_{20}$ modes of wave propagation, and will not, as indicated in FIG. 3, sustain any of the other $TE_{10}$, $TE_{11}$, $TM_{11}$, or $Te_{30}$ propagation modes. Thus, only the RF input signal in the $TE_{10}$ mode of propagation and the local oscillator signal in the $TE_{20}$ mode of propagation will be sustained within the rectangular waveguide 10. These $TE_{10}$ and $TE_{20}$ modes will frequency mix as previously explained at the reverse poled diodes 22 and 24 to generate an intermediate frequency output signal at the IF output node 28 as indicated in FIGS. 1 and 2.

Figure 4:
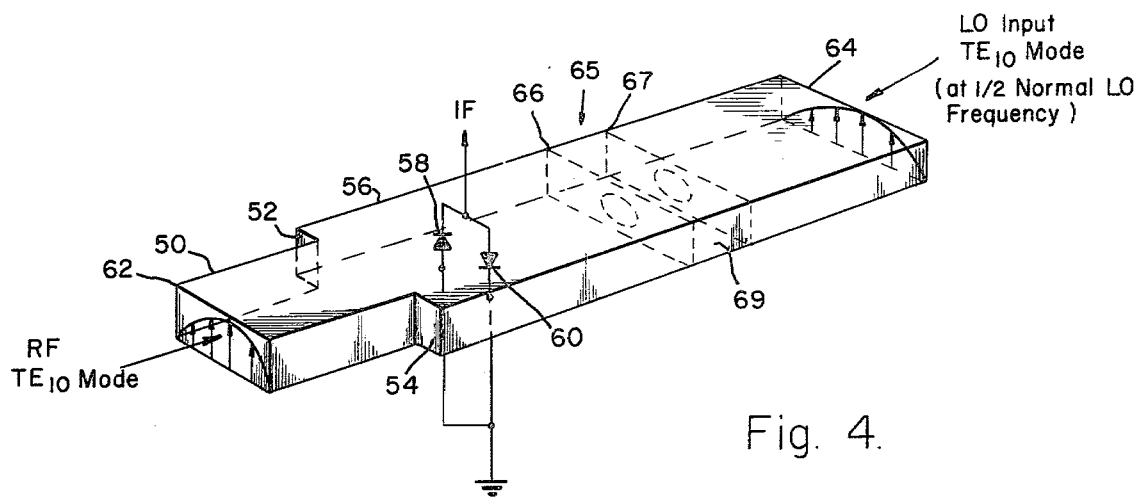
FIG. 4 illustrates an alternative embodiment of the invention wherein the physical spacing of the mixer diodes is less critical than in FIG. 1 and wherein the local oscillator frequency is one-half that used in FIG. 1.

Referring now to FIG. 4, there is shown an alternative embodiment of our invention wherein the RF input signal remains in the $TE_{10}$ mode, but the local oscillator signal is now also in the $TE_{10}$ mode. Further, the local oscillator frequency in FIG. 4 is the $\frac{1}{2}$ sub-harmonic frequency of the normal local oscillator frequency in FIGS. 1 and 2, which is defined as the difference between the RF and IF signal frequencies. The mixer structure in FIG. 4 includes an RF input section 50 which is joined to the end walls 52 and 54 of a larger local oscillator (LO) band pass section 56. The section 56 includes the diode mixer pair 58 and 60 mounted between top and bottom waveguide walls in the manner previously described, and the local oscillator band pass filter 65 will not pass RF frequencies. This filter 65 consists of a pair of thin vanes 66 and 67, each having central openings therein through which the local oscillator energy propagates. The thin vanes 66 and 67 define two sides of the cavity region 69 and in a standard bandpass filter construction well known in the art. Thus, this filter 65 prevents any RF signal from entering the source (not shown) of local oscillator signals. In a similar fashion, the RF input section 50 is cut off for local oscillator frequencies, thereby keeping such frequencies out of the RF signal source (not shown).

In the mixer arrangement of FIG. 4, the RF input signal and the mixer diode electrical connection are the same as those described in the previous mixers in FIGS. 1 and 2. However, the one-half sub-harmonic local oscillator signal in FIG. 4 whose electromagnetic field vector pattern is shown at the right hand port 64 in FIG. 4 is at one-half the normal local oscillator frequency (difference between RF and IF frequencies) and is input into the overmoded mixer cavity section 56 in the $TE_{10}$ mode. For example, if the RF signal frequency is in the vicinity of 94 GHz, then typically the one-half sub-harmonic local oscillator frequency will be at 46 GHz in order to generate an IF difference frequency of 2 GHz, plus or minus variations in the RF signal frequency. In this case, the "normal" or RF minus IF difference frequency is 92 GHz, whereas the one-half sub-harmonic of this normal local oscillator frequency is 46 GHz.

This sub-harmonic driven mixer in FIG. 4 is also similar to the previously described bi-mode mixers in FIGS. 1 and 2 in that the mixing cavity section 56 is oversize and is capable of propagating both the $TE_{10}$ and the $TE_{20}$ waveguide modes. Additionally, the mixer diodes 58 and 60 are connected electrically in parallel with opposite polarities in order to generate the necessary IF difference currents therein. However, in the mixer in FIG. 4 only the $TE_{10}$ mode is used for both the RF and local oscillator signals, and the physical separation of the diodes 58 and 60 only needs to be sufficient to allow room to mount the diodes electrically in the position shown. As compared to the previous embodiments of FIGS. 1 and 2, both of the diodes 58 and 60 can now be located closer to the center of the waveguide width dimension, near the a/2 location and positioned symmetrically with respect to the a/2 width location in the waveguide. By using this symmetrical mounting for the diodes 58 and 60, any effects of the $TE_{20}$ mode energy on the diode currents will be cancelled. However, the actual diode separation may be varied slightly in order to provide additional adjustment for properly impedance matching the diodes 58 and 60 to the RF signal source, thereby maximizing the output power of the mixer.

The width of the waveguide and the mixing cavity in FIG. 4 would be constrained by the following relationships:

$$\lambda \leq a \leq \frac{3}{2} \lambda \qquad \text{Equation (1)}$$

and $$\frac{\lambda_{LO}}{2} \leq a \leq \tfrac{3}{2} \lambda_{LO}, \qquad \text{Equation (2)}$$

where $\lambda$ and $\lambda_{LO}$ are the free space wavelengths of the RF and local oscillator signals, respectively. These equational constraints provide the largest possible cavity which will support the desired signal waveguide modes without introducing unnecessary additional modes therein. If the additional constraint is imposed on the mixer of FIG. 4 that the b/a ratio is sufficiently small to eliminate propagation of the $TE_{01}$ waveguide mode at the RF frequency, then the only two modes which can exist in the mixing cavity section 56 are the desired $TE_{10}$ mode and one additional mode, the $TE_{20}$ mode which is not used. In this case, the possible existance of the $TE_{20}$ RF mode is a consequence of the wider waveguide required to support the sub-harmonic local oscillator signal propagation. The prevention of exitation of this $TE_{20}$ mode is accomplished by maintaining symmetry in the waveguide with respect to the center line or a/2 waveguide width position.

One novel feature embodied in FIG. 4 is the use of the overmoded waveguide cavity to provide the added room useful in the fabrication of these waveguide mixers at high millimeter wave frequencies up to 300 GHz or higher. Because of the increasing difficulty of obtaining millimeter wave local oscillator sources at these high millimeter wave frequencies, one of the main advantages of this mixer configuration in FIG. 4 is its utilization of the sub-harmonic local oscillator frequency. Also, the use of a lower local oscillator frequency reduces the overall power requirements of the mixer.

The per se electrical mixing in a pair of reverse-poled parallel-connected diodes is described in some detail by M. V. Schneider et al in the above cited Bell System Technical Journal reference and teaches the balanced mixer operation within a waveguide structure.

Various modifications may be made to the above-described embodiments of our invention without departing with the true scope thereof. For example, the input $TE_{10}$ waveguide sections 30 and 36 in FIG. 2 are of conventional waveguide construction and may be modified or replaced with other existing wave propagation structures in order to superimpose the $TE_{10}$ and $TE_{20}$ field patterns upon one another at the mixer diodes 22 and 24. Specifically, the twisted waveguide mode conversion structures such as those described, for example, by Montgomery et al in Principles of Microwave Circuits, Radiation Laboratory Series, No. 8, pp. 334 et seq may be subtituted for the cavity section 41 in FIG. 2 above in order to convert the $TE_{10}$ mode of wave propagation into the $TE_{20}$ mode at the local oscillator input port 14.

Additionally, it should be understood the output "T" connection shown is just one of several available output connections and such output connection may, if desired be modified and implemented in microstrip, stripline, or other transmission line configuration and technique known to those skilled in the art.

What is claimed is:

1. A balanced waveguide mixer structure for generating an intermediate frequency (IF) output signal in response to the mixing of local oscillator and incoming RF input signals, comprising:
   (a) means including a rectangular waveguide for propagating RF and local oscillator signals to a chosen location within said waveguide and in preselected modes of waveguide propagation, and
   (b) means including a pair of parallel-connected and reverse-poled mixer diodes connected at said chosen location between top and bottom walls of said waveguide, said diodes symetrically spaced along the width dimension of said waveguide with respect to the one-half width location in said waveguide and further positioned at predetermined width locations along said width dimension of said waveguide for generating said IF signals at a circuit node common to both of said diodes.

2. The mixer defined in claim 1 which includes means for propagating preselected but different ones of the $TE_{10}$ and $TE_{20}$ waveguide modes of local oscillator and RF input signals to said mixer diodes and for superimposing the different electromagnetic field vector patterns for said $TE_{10}$ and $TE_{20}$ modes upon one another at said diodes.

3. The mixer defined in claim 1 which includes means for propagating said local oscillator signal to said mixer diodes at approximately the one-half sub-harmonic frequency of a normal local oscillator frequency which is defined as the difference between the RF and IF signal frequencies, and in the same $TE_{10}$ waveguide mode as the $TE_{10}$ waveguide mode of the said RF input signal.

4. A method for mixing RF input and local oscillator signals to obtain an intermediate frequency (IF) output signal, including:
   (a) propagating RF input and local oscillator signals having preselected waveguide modes to a chosen location in a rectangular waveguide,
   (b) providing a pair of parallel-connected and reverse-poled mixer diodes at said chosen location and symmetrically spaced along the width dimension of said waveguide with respect to the one-half width location in said waveguide and
   (c) positioning said diodes at predetermined width locations along said width dimension of said waveguide for generating an intermediate frequency output signal proportional to the difference currents flowing in said mixer diodes.

5. The method defined in claim 4 which includes propagating different $TE_{10}$ and $TE_{20}$ waveguide mode signals to said diodes from sources of RF input and local oscillator signals, whereby the different electromagnetic field vector patterns for said $TE_{10}$ and $TE_{20}$ modes are superimposed upon each other to generate said intermediate frequency output signal.

6. The method defined in claim 4 which includes propagating a local oscillator $TE_{10}$ mode signal to said diodes at approximately the one-half sub-harmonic frequency of a normal local oscillator frequency which is defined as the difference between RF and IF signal frequencies, and mixing said local oscillator $TE_{10}$ mode signal with said incoming $TE_{10}$ RF signal to generate said intermediate frequency output signal at a common output mode for said diodes.

7. A balanced mixer for generating an intermediate frequency output signal in response to the mixing of local oscillator and incoming RF signals, and with an optimized mixer conversion efficiency comprising:
   (a) a rectangular waveguide of a predetermined width, a, corresponding to wave propagation frequencies in the range of between two and three times the cut-off frequency of the $TE_{10}$ mode of wave propagation and a predetermined height, b, such that the ratio of b/a precludes propagation therein of the $TE_{01}$ waveguide mode,
   (b) a first mixer diode connected between opposing walls of said rectangular waveguide and at a location approximately ¼ the total width dimension, a, thereof,
   (c) a second mixer diode connected between said opposing walls of said rectangular waveguide and located at a distance of approximately ¾ of the total width dimension, a, thereof, said diodes being connected in parallel with reverse polarities,
   (d) means coupled to said rectangular waveguide for applying a local oscillator signal of the $TE_{20}$ mode of propagation to said first and second mixer diodes,
   (e) means coupled to said rectangular waveguide for applying an input RF signal of the $TE_{10}$ propagation mode to said first and second mixer diodes, and
   (f) means including a circuit node common to said first and second mixer diodes for conducting an intermediate frequency output signal therefrom as a result of differential currents in said first and second mixer diodes.

8. The mixer defined in claim 7 wherein said means for applying RF and local oscillator signals include separate waveguide means coupled to opposite ends of said rectangular waveguide for coupling said local oscillator and RF signals to said mixer diodes, whereby the intensity vectors of the electromagnetic fields of said local oscillator and RF signals provide an optimum addition at one mixer diode and an optimum subtraction at the other mixer diode as a result of the superimposition of the transverse electric field intensity patterns of said $TE_{10}$ and $TE_{20}$ propagation modes at approximately the a/4 and 3a/4 spacings of said mixer diodes along the width of said waveguide and at the maxima points on said $TE_{20}$ mode field pattern.

9. The mixer defined in claim 8 wherein said means for conducting output IF signal from said mixer diodes includes a T connection including separate conductor portions thereof connected to said first and second mixer diodes, respectively, and a common output conductor joined to both said conductor portions for conducting IF output signals.

10. The mixer defined in claim 9 wherein said means for applying an RF signal includes another rectangular waveguide member of predetermined width less than the corresponding width, a, of the first named rectangular waveguide and joined to one end of said first named rectangular waveguide on one side of said mixer diodes for coupling $TE_{10}$ mode RF signals to said mixer diodes; and a RF signal short vane centrally disposed on the other side of said mixer diodes for preventing RF $TE_{10}$ mode signals from entering the source of said local oscillator signals.

11. The mixer defined in claim 10 wherein said means for applying said local oscillator $TE_{20}$ mode signals to said mixer diodes includes a further waveguide section perpendicularly joined to the other end of said first named rectangular waveguide and including a mode conversion cavity and an adjustable tuning short therein for converting the $TE_{10}$ mode of local oscillator signals applied thereto to $TE_{20}$ mode energy at said other end of said first named rectangular waveguide, whereby the $TE_{20}$ mode local oscillator energy is coupled to said mixer diodes and mixed with $TE_{10}$ energy from said RF signals.

12. A method for mixing millimeter wave RF energy out to 300 GHz or higher with a local oscillator signal to thereby generate an IF output signal in a rectangular waveguide including a pair of oppositely-poled parallel connected mixer diodes therein, comprising:
(a) selecting a rectangular waveguide of a height-to-width aspect ratio corresponding to propagation frequencies in a range of between 2 and 3 times the ratio of the RF input frequency to the cut-off frequency of the $TE_{10}$ mode of wave propagation in said waveguide, and precluding propagation therein of all waveguide modes except the $TE_{10}$ and $TE_{20}$ modes,
(b) applying the $TE_{20}$ propagation mode of local oscillator energy to said diodes, and
(c) applying the $TE_{10}$ propagation mode of RF input energy to said diodes, whereby the superimposition of the transverse electric field vectors of said $TE_{10}$ and $TE_{20}$ propagation modes at said diodes generate sum and difference currents therein for efficiently producing an output IF signal.

13. The method defined in claim 13 which includes aligning the two maxima points on the $TE_{20}$ field vector pattern with the respective positions of the mixer diodes in said waveguide and then summing the superimposed $TE_{10}$ field vectors of RF energy and $TE_{20}$ field vectors of local oscillator input energy to provide an optimum of energy addition and subtraction at said diodes, thereby optimizing the IF conversion efficiency at said diodes.

14. The method defined in claim 13 wherein said height-to-width aspect ratio of said waveguide is selected such that only the $TE_{10}$ and $TE_{20}$ waveguide modes can effectively propagate in said waveguide and said waveguide cuts off higher order modes.

15. A balanced mixer for generating an intermediate frequency output signal in response to the mixing of local oscillator and incoming RF input signals comprising:
(a) a waveguide having a pair of parallel-connected and reverse poled mixer diodes connected between top and bottom walls thereof and spaced symmetrically with respect to the one-half width dimension, $a/2$, thereof, where the width, $a$, has a value which is related to the RF input signal free space wavelength, $\lambda$, and to the local oscillator signal free space wavelength, $\lambda_{LO}$, by the expression $$\lambda \leq a \leq \frac{3}{2}\lambda,$$

and by the expression $$\frac{\lambda_{LO}}{2} \leq a \leq \frac{3}{4}\lambda_{LO},$$

respectively.

* * * * *